US011146222B2

(12) United States Patent
Shindoh et al.

(10) Patent No.: US 11,146,222 B2
(45) Date of Patent: Oct. 12, 2021

(54) AMPLIFIER, RADIATION DETECTOR, AND RADIATION DETECTOR CONTROL METHOD

(71) Applicant: SHARP KABUSHIKI KAISHA, Sakai (JP)

(72) Inventors: Takahiro Shindoh, Sakai (JP); Kunihiko Iizuka, Sakai (JP); Shigenari Taguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 53 days.

(21) Appl. No.: 16/616,334

(22) PCT Filed: Mar. 19, 2018

(86) PCT No.: PCT/JP2018/010673
§ 371 (c)(1),
(2) Date: Nov. 22, 2019

(87) PCT Pub. No.: WO2018/216328
PCT Pub. Date: Nov. 29, 2018

(65) Prior Publication Data
US 2020/0177141 A1    Jun. 4, 2020

(30) Foreign Application Priority Data
May 25, 2017 (JP) .............................. JP2017-103894

(51) Int. Cl.
*H03F 3/08* (2006.01)
*G01T 1/17* (2006.01)
*G01T 1/24* (2006.01)
*H01L 31/08* (2006.01)
*H03F 3/19* (2006.01)

(52) U.S. Cl.
CPC ................. *H03F 3/08* (2013.01); *G01T 1/17* (2013.01); *G01T 1/247* (2013.01); *H01L 31/08* (2013.01); *H03F 3/19* (2013.01)

(58) Field of Classification Search
CPC ..... H03F 3/08; H03F 3/19; G01T 1/17; G01T 1/247; H01L 31/08
See application file for complete search history.

(56) References Cited

U.S. PATENT DOCUMENTS 9,621,829 B1 * 4/2017 Boemler .............. H04N 5/3745
2003/0071222 A1 * 4/2003 Harvey ................ G01R 29/24
250/397

FOREIGN PATENT DOCUMENTS

JP        2016-152613 A    8/2016

* cited by examiner

*Primary Examiner* — Hugh Maupin
(74) *Attorney, Agent, or Firm* — ScienBiziP, P.C.

(57) ABSTRACT

The circuit area of an amplifier provided in a photon-counting radiation detector is decreased compared with the related art. A pulse amplification measurement circuit includes: an inverting amplification circuit that inverts and amplifies an input signal to generate an inverted amplified output; a feedback transistor that connects an input unit and an output unit of the inverting amplification circuit to each other; and a pulse measurement circuit that generates an output signal corresponding to the number of pulses of the inverted amplified output. The pulse measurement circuit is capable of supplying the output signal toward the feedback transistor.

7 Claims, 7 Drawing Sheets

AMPLIFIER, RADIATION DETECTOR, AND RADIATION DETECTOR CONTROL METHOD

TECHNICAL FIELD

An aspect of the present invention relates to an amplifier provided in a photon-counting radiation detector.

BACKGROUND ART

In recent years, various techniques for measuring radiation (for example, X-rays) have been developed. For example, a photon-counting radiation detector that detects radiation by counting the number of photons of the radiation incident on the photon-counting radiation detector has been developed.

The photon-counting radiation detector has a configuration including a combination of (i) a sensor element that outputs an electrical signal corresponding to the number of photons of the radiation and (ii) an amplifier formed of transistors (for example, a complementary metal oxide semiconductor (CMOS) integrated circuit). In the photon-counting radiation detector, the electrical signals received from the sensor element are amplified by the amplifier and pulses are generated, and the number of generated pulses is counted for a predetermined time to detect the radiation.

As an example, Patent Literature 1 discloses a technique for configuring an amplifier using transistors other than metal oxide semiconductor field effect transistors (MOS-FETs) in a photon-counting radiation detector. According to the technique of Patent Literature 1, for example, thin film transistors (TFTs) can be used as the transistors of the amplifier.

More specifically, the amplifier of Patent Literature 1 is provided with a regulator circuit for regulating a voltage applied to a control terminal (gate) of a feedback transistor so that as inverter group does not oscillate. The regulator circuit includes an oscillation detector and a ramp generator. By providing the regulator circuit, a transistor other than a MOSFET (for example, a TFT) can be applied to the amplifier.

CITATION LIST

Patent Literature

PTL 1: Japanese Unexamined Patent Application Publication No. 2016-152613 (published on Aug. 22, 2016)

SUMMARY OF INVENTION

Technical Problem

However, in the technique of Patent Literature 1, it is necessary to individually provide the regulator circuit including the oscillation detector and the ramp generator for each amplifier. Accordingly, there is a problem that the circuit area of the amplifier is increased. An aspect of the present invention is to decrease the circuit area or an amplifier provided in a photon-counting radiation detector compared with the related art.

Solution to Problem

To solve the problem, an amplifier according to an aspect of the present invention is an amplifier provided in a photon-counting radiation detector, and includes: an inverting amplification unit that inverts and amplifies an input signal to generate an inverted amplified output; a feedback transistor that connects an input unit and an output unit of the inverting amplification unit to each other; and a pulse measurement unit that generates an output signal corresponding to a number of pulses of the inverted amplified output, in which the pulse measurement unit is capable of supplying the output signal toward the feedback transistor.

Advantageous Effects of Invention

According to an amplifier of an aspect of the present invention, it is possible to decrease circuit area compared with the related art.

DESCRIPTION OF EMBODIMENTS

Embodiment 1

Hereinafter, Embodiment 1 is described in detail with reference to FIGS. 1 to 3. Further, in the following description, a description of matters that are not related to Embodiment 1 is omitted as appropriate. It may be understood that each member of a pulse amplification measurement circuit 1 (amplifier) of Embodiment 1 whose description is omitted is similar to that of a well-known technique.

(Pulse Amplification Measurement Circuit 1)

Figure 1:
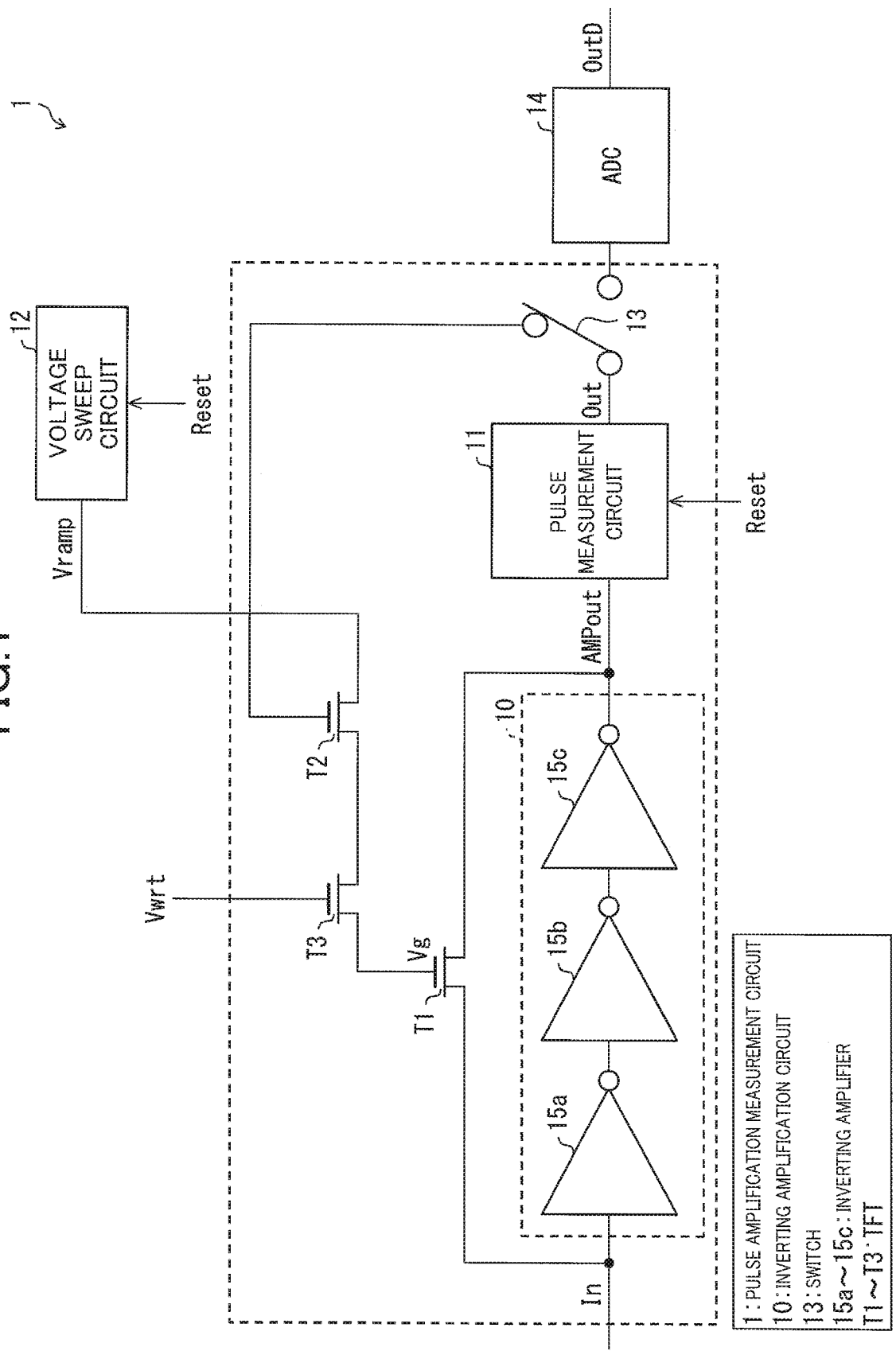
FIG. 1 is a diagram schematically illustrating a configuration of a pulse amplification measurement circuit according to Embodiment 1.

FIG. 1 is a diagram schematically illustrating a configuration of a pulse amplification measurement circuit 1. The pulse amplification measurement circuit 1 includes an inverting amplification circuit 10 (inverting amplification unit), a pulse measurement circuit 11 (pulse measurement unit), a voltage sweep circuit 12 (voltage sweep unit), a switch 13, and transistors T1 to T3.

The inverting amplification circuit 10 includes three inverting amplifiers 15a to 15c. Further, an analog-to-digital converter (ADC) 14 is provided outside the pulse amplification measurement circuit 1. The ADC 14 may be provided in a radiation detector 300 to be described later.

The voltage sweep circuit 12 and the transistors T1 to T3 may collectively be referred to as a regulator circuit. The transistors T2 (second transistor) and T3 (third transistor) may be referred to as an oscillation interlock switch and a potential fixing switch, respectively. The transistor T1 (feedback transistor) may be referred to as a feedback switch. The transistor T1 functions similarly to the feedback transistor in Patent Literature 1.

Figure 2:
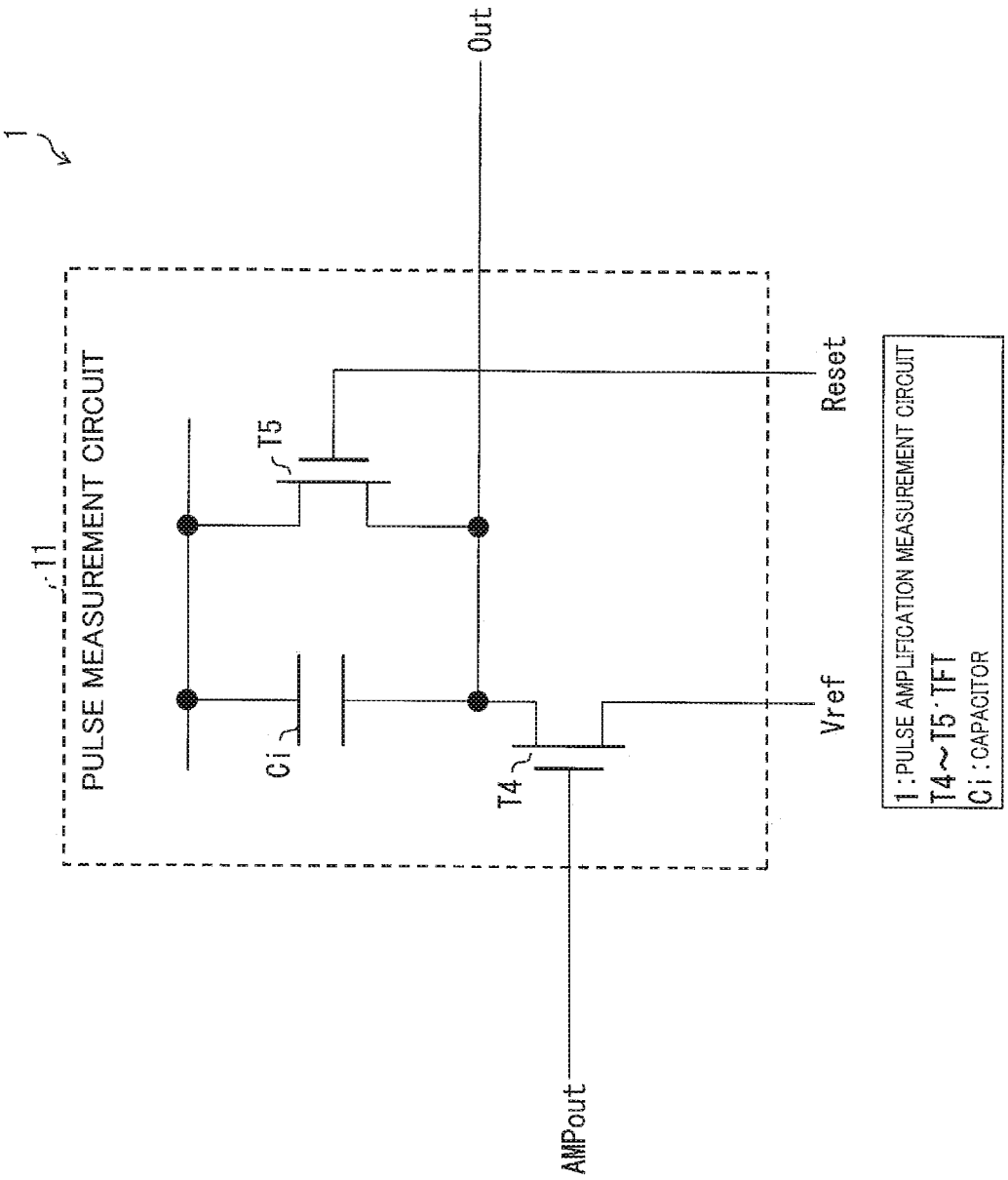
FIG. 2 is a diagram schematically illustrating a configuration of the pulse measurement circuit in FIG. 1.

In addition, FIG. 2 is a diagram schematically illustrating a configuration of the pulse measurement circuit 11. The pulse measurement circuit 11 includes transistors T4 and T5 and a capacitor Ci. Since the configuration and operation of the pulse measurement circuit 11 are known, description thereof is omitted.

The transistors T1 to T5 function as switching elements. In Embodiment 1, similar to Patent Literature 1, each transistor in the pulse amplification measurement circuit 1 may be, for example, a thin film transistor (TFT). However, each transistor may be a transistor other than the TFT. Each transistor may be any type of field effect transistor (FET).

In Embodiment 1, a case where the transistors T1 to T5 are TFTs is exemplified. More specifically, a case where the transistors T1 to T5 are n-type TFTs is exemplified. However, the transistors T1 to T5 may be p-type TFTs. In addition, the switch 13 and the inverting amplification circuit 10 (inverting amplifiers 15a to 15c) may be TFTs.

An input signal In is supplied to the inverting amplification circuit 10 of the pulse amplification measurement circuit 1 from a sensor element 35 (not illustrated in FIG. 1) in FIG. 6 to be described later. The sensor element 35 may be a known radiation sensor element. The sensor element 35 generates an electrical signal (voltage pulse signal) as the input signal In corresponding to the number of photons of radiation (more specifically, a radiation dose) incident on the sensor element.

The inverting amplification circuit 10 inverts and amplifies the input signal In to generate an amplified output signal AMPout (inverted amplified output). Therefore, the amplified output signal AMPout is a voltage pulse signal having a polarity opposite to that of the input signal In. An output terminal of the inverting amplification circuit 10 is connected to the pulse measurement circuit 11 and the drain of the transistor T1 (feedback transistor). The inverting amplification circuit 10 outputs the amplified output signal AMPout to the pulse measurement circuit 11.

The inverting amplification circuit 10 may be configured by connecting an odd number of inverting amplification circuits that invert and amplify a signal input thereto and output the amplified signal to each other in series (in a cascading manner). In Embodiment 1, the inverting amplification circuit 10 includes the three inverting amplifiers 15a to 15c. The number of inverting amplifiers provided in the inverting amplification circuit 10 may simply be an odd number and is not particularly limited (see also FIG. 4, to be described later).

The amplification factor of the inverting amplification circuit 10 is determined by the number of inverting amplifiers. Therefore, to increase the amplification factor of the inverting amplification circuit 10, the number of inverters may be increased. However, when the number of inverters is increased, the inverting amplification circuit 10 (more specifically, a feedback control system in the pulse amplification measurement circuit 1) becomes unstable, such that oscillation easily occurs in the inverting amplification circuit 10. Therefore, it is preferable that the number of inverting amplifiers be set in consideration of the amplification factor and stability of the inverting amplification circuit 10.

The pulse measurement circuit 11 receives the amplified output signal AMPout. The pulse measurement circuit 11 is a circuit for measuring (counting) the number of pulses of the amplified output signal AMPout. Specifically, an output signal Out of the pulse measurement circuit 11 is used as an index of the number of pulses of the amplified output signal AMPout.

A reset signal Reset is supplied to the pulse measurement circuit 11 and the voltage sweep circuit 12. The reset signal Reset may be supplied from a control circuit 31 to be described later to each of the pulse measurement circuit 11 and the voltage sweep circuit 12 (see also FIG. 7).

In the pulse measurement circuit 11, the reset signal Reset is used as a signal for initializing the value (voltage value) of the output signal Out. Specifically, in a case where the reset signal Reset (a pulse of the reset signal Reset) having a high level value is input to the pulse measurement circuit 11, the output signal Out is initialized a high level value (maximum value) (hereinafter, referred to as a voltage VHIGH).

Next, the pulse measurement circuit 11 generates the output signal corresponding to the number of pulses of the amplified output signal AMPout. More specifically, the pulse measurement circuit 11 decreases the value of the output signal Out by a predetermined value each time one pulse of the amplified output signal AMPout is input to the pulse measurement circuit 11. Therefore, it is possible to measure the number of pulses of the amplified output signal AMPout (that is, the number of pulses of the input signal In) by measuring how much the value of the output signal Out is decreased from VHIGH.

The switch 13 switches a supply destination of the output signal Out output from the pulse measurement circuit to either the ADC 14 or the transistor T2 (more specifically, the gate of the transistor T2). By providing the switch 13, the pulse measurement circuit 11 can output the output signal Out to either the outside or the inside of the pulse amplification measurement circuit 1.

First, as illustrated in FIG. 1, it is assumed that the switch 13 supplies the output signal Out to the gate of the transistor T2. In this case, it may be understood that the pulse measurement circuit 11 supplies the output signal Out toward the transistor T1.

Therefore, it may be understood that the switch 13 switches the supply destination of the output signal Out either (i) toward the transistor T1 (to the inside of the pulse amplification measurement circuit 1) or (ii) to the outside (the ADD 14) of the pulse amplification measurement circuit 1.

In a case where the output signal Out is supplied toward the transistor T1, the pulse measurement circuit 11 is connected to the transistor T1 through the transistors T2 and T3. More specifically, the pulse measurement circuit 11 connected to the gate of the transistor T2, and the transistor T2 is connected to the gate of the transistor T1 through the transistor T3.

The pulse amplification measurement circuit 1 requires a period (regulating period) for regulating feedback resistance (resistance between the source and the drain of the transistor T1) of the inverting amplification circuit 10 before starting measurement of the pulse, similarly to the amplifier in Patent Literature 1. In the regulating period, the switch 13 supplies the output signal Out to the gate of the transistor T2. That is, the output signal Out is supplied to the regulator circuit described above.

The drain of the transistor T2 connected to the voltage sweep circuit 12. The voltage sweep circuit 12 supplies a voltage Vramp (second voltage signal) to the drain of the transistor T2. In the voltage sweep circuit 12, the reset signal Reset is used as a signal for initializing a value of the voltage Vramp.

Note that a case where the pulse amplification measurement circuit 1 includes the voltage sweep circuit 12 is exemplified for convenience of explanation in Embodiment 1, but the voltage sweep circuit 12 is not an essential component of the pulse amplification measurement circuit 1. The voltage sweep circuit 12 may be provided outside the amplifier according to an aspect of the present invention (see Embodiment 3, to be described later).

The voltage Vramp is a voltage that temporally increases at a constant rate from the value (minimum value) initialized by the reset signal Reset. That is, the voltage Vramp is a voltage signal having a ramp waveform (inclined waveform) (see also FIG. 3, to be described later).

The source of the transistor T2 is connected to the drain of the transistor T3. Therefore, the output signal Out supplied to the gate of the transistor T2 can be used as a signal for controlling switch on/switch off (conduction/non-conduction) of the transistor T2.

That is, a conduction state between the source and the drain of the transistor T2 (in other words, a connection state between the voltage sweep circuit 12 and the drain of the transistor T3) can be controlled by the output signal Out. When the output signal Out is large to a certain extent, the transistor T2 is switched on, and the voltage Vramp can thus be supplied from the voltage sweep circuit 12 to the drain of the transistor T3.

The source of the transistor T3 is connected to the gate of the transistor T1. Hereinafter, a gate voltage of the transistor T1 is referred to as a voltage Vg. A voltage Vwrt (third voltage signal) is supplied to the gate of the transistor T3. The voltage Vwrt may be supplied from a control circuit 31 to be described later to the transistor T3 (see also FIG. 7).

The voltage Vwrt is a signal for controlling switch on/switch off of the transistor T3. That is, the voltage Vwrt is a signal for controlling a conduction state between the source and the drain of the transistor T3 (in other words, a connection state between the source of the transistor T2 and the gate of the transistor T1).

In a case where the voltage Vwrt is large to a certain extent, the transistor T3 is switched on. Therefore, in a case where each of the voltage Vwrt and the output signal Out is large to a certain extent, the transistors T2 and T3 are switched on, and the voltage Vramp can thus be supplied from the voltage sweep circuit 12 to the gate of the transistor T1. In this case, the voltage Vg becomes equal to the voltage Vramp.

The source and the drain of the transistor T1 are connected to an input side (input unit) and an output side (output unit) of the inverting amplification, circuit 10, respectively. That is, the transistor T1 is a switching element connecting the input side and the output side of the inverting amplification circuit 10 to each other. In a case where the transistor T1 is in a switch-on state, the transistor T1 causes the output (the amplified output signal AMPout) of the inverting amplification circuit 10 to feed back to the input side.

As illustrated in Patent Literature 1, it is preferable that the resistance value between the source and the drain of the transistor T1 be as low as possible within a range in which the pulse amplification measurement circuit 1 does not perform amplification. As described above, the resistance value between the source and the drain of the transistor T1 decreases as the voltage Vg increases. Accordingly, it is preferable that the voltage Vg be as high as possible within a range in which the pulse amplification measurement circuit 1 does not perform amplification.

(Example of Change in Each Voltage in Pulse Amplification Measurement Circuit 1)

Figure 3:
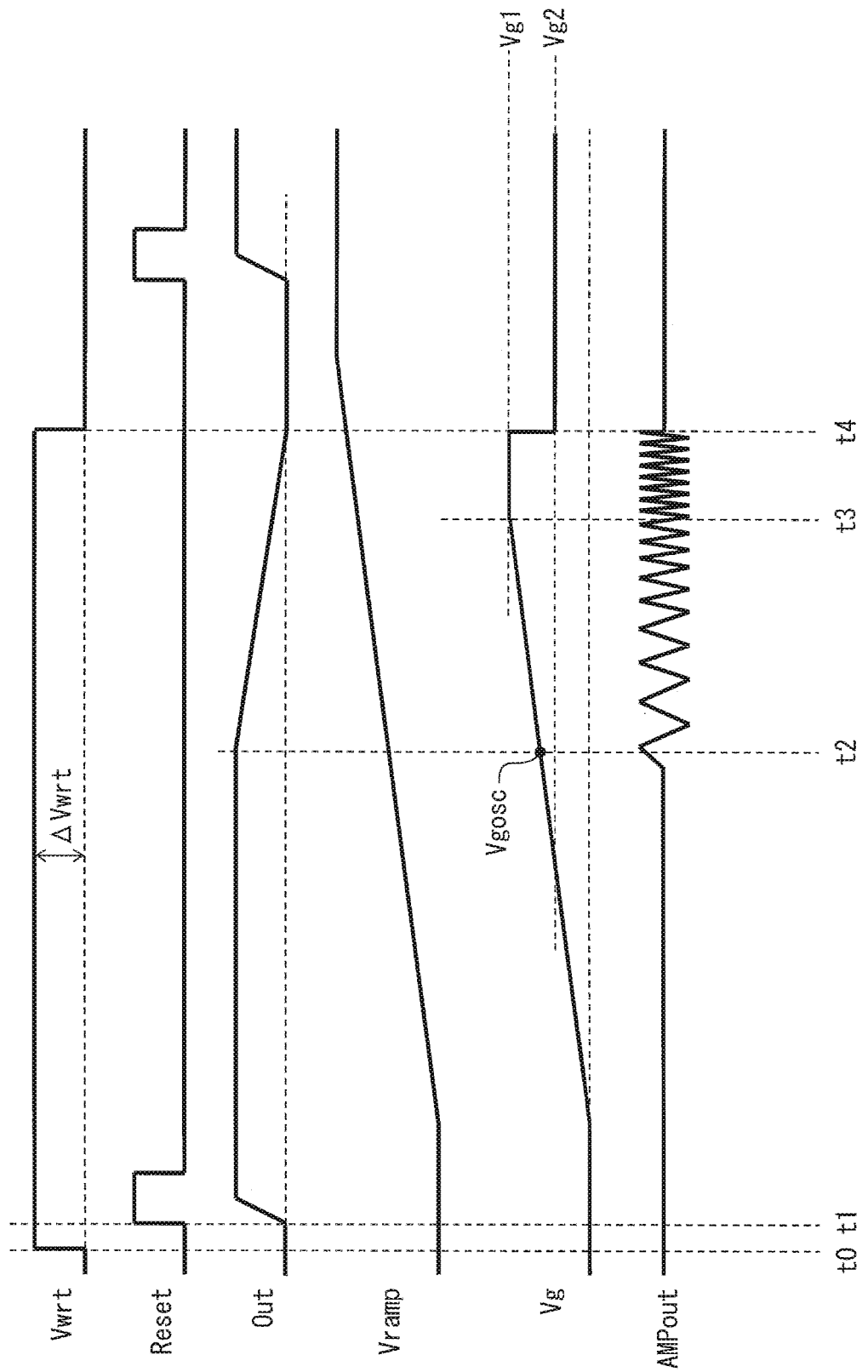
FIG. 3 is a diagram illustrating an example of a change in each voltage in the pulse amplification measurement circuit of FIG. 1.

FIG. 3 is a time chart illustrating an example of a change in voltage in the pulse amplification measurement circuit 1. First, at time t0, the voltage Vwrt is switched to a high level value, such that the transistor T3 is switched on.

Subsequently, at time t1, the reset signal Reset is switched to the high level value. As a result, the value of the output signal Out is initialized to the voltage VHIGH (high level value), such that the transistor T2 is switched on. Therefore, the voltage Vramp can be supplied from the voltage sweep circuit 12 to the gate of the transistor T1. That is, the voltage Vg can be made equal to the voltage Vramp.

The reset signal Reset is switched to the high level value at time t1, such that the voltage Vramp can be increased at a constant rate with the lapse of time. That is, the voltage Vg can be swept from a low voltage to a high voltage by the voltage Vramp. Therefore, the resistance value between the source and the drain of the transistor T1 can decrease according to an increase in the voltage Vg.

Next, at time t2, as the resistance value between the source and the drain of the transistor T1 decreases, the oscillation starts in the inverting amplification, circuit 10. That is, the amplified output signal AMPout starts to oscillate. As a result, in accordance with the oscillation of the amplification output signal AMPout, the value of the output signal Out gradually decreases from VHIGH with the passage of time. As such, the oscillation of the inverting amplification circuit 10 can be detected by using the pulse measurement circuit 11 (by the output signal Out).

The voltage Vg increases so as to follow the voltage Vramp until time t3 to be described later (that is, until the transistor T2 is switched off) even after time t2. Hereinafter, the voltage Vg at time t2 is referred to as a voltage Vgosc (oscillation start value). The voltage Vgosc is a gate voltage at which the oscillation starts in the inverting amplification circuit 10.

The resistance value between the source and the drain of the transistor T1 at the voltage Vgosc (that is, the resistance value between the source and the drain of the transistor T1 at which the oscillation starts in the inverting amplification circuit 10) is referred to as an oscillation start feedback resistance value.

In addition, as time passes from time t2, the oscillation frequency of the amplified output signal AMPout increases in accordance with a decrease in the resistance value between the source and the drain of the transistor T1. Accordingly, as illustrated in FIG. 3, the oscillation cycle of the amplified output signal AMPout is shortened with the passage of time.

Thereafter, at time t3, when the value of the output signal Out reaches a low level value as the oscillation continues in the inverting amplification circuit 10, the transistor T2 is switched to a switch-off state. The transistor T2 is switched off, such that the voltage Vg is held at a voltage Vg1 (first value) at time t3. In addition, the voltage Vg1 is held, such that the resistance value between the source and the drain of the transistor T1 is also held at a constant value (first feedback resistance value) corresponding to the voltage Vg1. The first feedback resistance value is lower than the oscillation start feedback resistance value.

The voltage Vg1 is a gate voltage at a point in time when the transistor T2 is switched to the switch-off state. As illustrated in FIG. 3, the voltage Vg1 higher than the voltage Vgosc. Accordingly, the oscillation in the inverting amplification circuit 10 continues until time t4 to be described later.

A parasitic capacitance of the transistor T1 and a parasitic capacitance of each wiring in the pulse amplification measurement circuit 1 contribute to the holding of the voltage Vg1. However, as illustrated in Embodiment 2, to be described later, a capacitor Cm (memory capacitance) may be provided to hold the voltage Vg1.

After the voltage Vg is held at the voltage Vg1 the voltage Vwrt is switched to the low level value at time t4, such that the transistor T3 is switched off. As a result, at time t4, the voltage Vg is changed to a voltage Vg2 (second value) lower than the voltage Vg1 and the voltage Vgosc described above as electric charge is extracted from the gate of transistor T1 as described later.

As such, the voltage Vg is decreased to a voltage Vg2, such that the oscillation in the inverting amplification circuit 10 can be stopped at time t4. Since the oscillation is stopped after time t4, the voltage Vg2 is stably held. The voltage Vg2 is held, such that the resistance value between the source and the drain of the transistor T1 is also held at a constant value (second feedback resistance value) corresponding to the voltage Vg2. The second feedback resistance value is higher than the oscillation start feedback resistance value.

Here, (i) the high level value of the voltage Vwrt (that is, the value of the voltage Vwrt in a case where the transistor T3 is switched on) is Vh, and (ii) the low level value of the voltage Vwrt (that is, the value of the voltage Vwrt in a case where the transistor T3 is switched off) of the voltage Vwrt is Vl. In addition, a capacitance between the gate and the source of the transistor T3 is Cgs. In addition, a capacitance of the gate of the transistor T1 is Cg.

Next, a difference between the high level value and the low level value of the voltage Vwrt (that is, the amount of change in the voltage Vwrt) is represented as ΔVwrt=Vh−Vl. In addition, a difference between the voltage Vg1 and the voltage Vg2 (that is, the amount of change in the voltage Vg) is represented as Δvg=Vg1−Vg2.

In this case, the following Equation (1) is satisfied:

$$\Delta Vg = (Cgs/Cg) \times \Delta Vwrt \qquad (1).$$

That is, the voltage Vg2 is represented by the following Equation (2):

$$Vg2 = Vg1 - (Cgs/Cg) \times \Delta Vwrt \qquad (2).$$

Equations (1) and (2) mean that electric charge is extracted from the gate of the transistor T1 through the capacitance Cgs between the gate and the source of the transistor T3 by changing the voltage Vwrt.

As a result of such electric charge extraction, the voltage Vg (the gate voltage of the transistor T1) is changed to the voltage Vg2 lower than the voltage Vg1. By appropriately setting the value of ΔVwrt, a desired ΔVg (in other words, Vg2) can be obtained. That is, a value of the voltage Vg2 can be set to a value immediately before the oscillation starts in the inverting amplification circuit 10 (a value sufficiently close to the voltage Vgosc at which the oscillation starts) (hereinafter, referred to as a value immediately before the oscillation). In addition, the value of the voltage Vg2 can also be set by regulating the increase rate of the voltage Vramp.

By setting the voltage Vg2 to the value immediately before the oscillation by such regulation, the regulating period described above ends. By setting the voltage Vg2 to the value immediately before the oscillation, the resistance value between the source and the drain of the transistor T1 can be made sufficiently low within a range in which the inverting amplification circuit 10 does not oscillate.

When the regulating period ends, the supply destination of the output signal Out is switched to the ADC 14 by the switch 13. As described above, the output signal Out is an analog value whose value (voltage) decreases in accordance with the measurement of the number of pulses of the input signal In.

By the ADC 14 converting the output signal Out (analog value) into a digital value, the number of pulses of the input signal In can be measured more simply. The subsequent processing for measuring the number of pulses is known, and description thereof is thus omitted.

(Effect of Pulse Amplification Measurement Circuit 1)

According to the pulse amplification measurement circuit 1, it is possible to cause the pulse measurement circuit 11 to supply the output signal Out toward the transistor T1 by the switch 13. Then, as illustrated in FIG. 3 described above, the voltage Vg (the gate voltage of the transistor TI) can be regulated so that the inverting amplification circuit 10 does not oscillate. In other words, the resistance value between the source and the drain of the transistor T1 can be regulated so that the inverting amplification circuit 10 does not oscillate.

That is, the voltage Vg can be regulated without providing the regulator circuit (the regulator circuit including the oscillation detector and the ramp generator) of Patent Literature 1. Therefore, unlike in Patent Literature 1, there is no need to individually provide the regulator circuit for the amplifier (pulse amplification measurement circuit 1).

Therefore, the circuit area of the amplifier provided in the photon-counting radiation detector can be decreased compared with the related art. Furthermore, the circuit area of a radiation detector (for example, a radiation detector 300 to be described later) including the amplifier can also be decreased.

Embodiment 2

Embodiment 2 is described below with reference to FIGS. 4 and 5. For convenience of explanation, members having the same functions as those of the members described in the above embodiment are denoted by the same reference numerals, and description thereof is omitted.

(Pulse Amplification Measurement Circuit 2)

Figure 4:
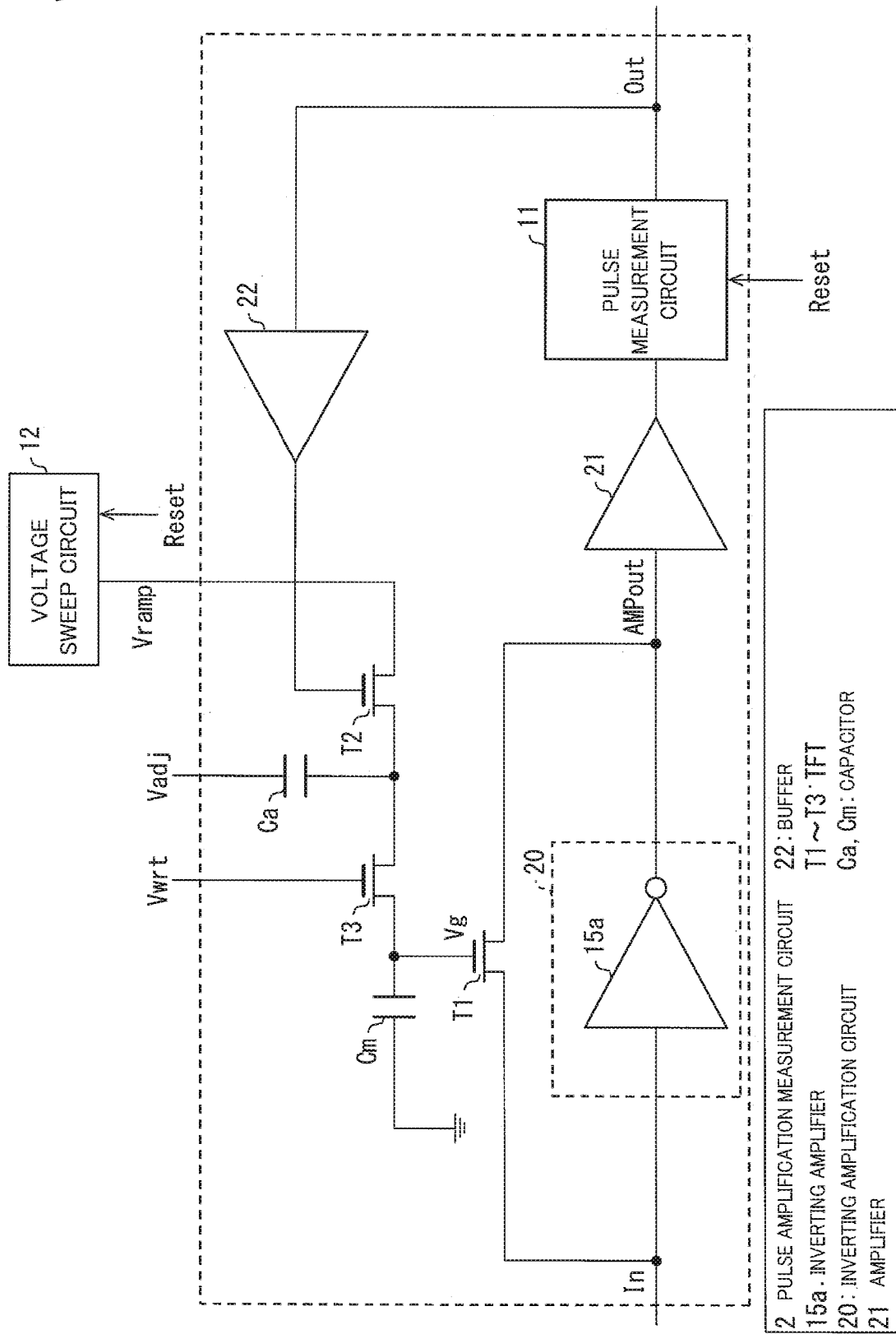
FIG. 4 is a diagram schematically illustrating a configuration of a pulse amplification measurement circuit according to Embodiment 2.

FIG. 4 is a diagram schematically illustrating a configuration of a pulse amplification measurement circuit 2 (amplifier) according to Embodiment 2. The pulse amplification measurement circuit 2 has a configuration in which (i) the inverting amplification circuit 10 in the pulse amplification measurement circuit 1 is replaced by an inverting amplification circuit 20 (inverting amplification unit) and (ii) an amplifier 21, a buffer 22, a capacitor Ca, and a capacitor Cm are added. In FIG. 4, illustration of the switch 13 and the ADC 14 is omitted for convenience of explanation. The same applies to FIGS. 6 and 7 to be described later.

The inverting amplification circuit 20 is different from the inverting amplification circuit 10 in that the inverting amplification circuit 20 includes only one inverting amplifier 15a. In the pulse amplification measurement circuit 2, an output side of the inverting amplification circuit 20 and an input side of a pulse measurement circuit 11 are connected to each other through the amplifier 21.

The amplifier 21 may be a known non-inverting amplifier. In the pulse amplification measurement circuit 2, an amplified output signal AMPout is further amplified by the amplifier 21, and the amplified output signal AMPout after being amplified is input to the pulse measurement circuit 11.

In the pulse amplification measurement circuit 2, an output side of the pulse measurement circuit 11 and the gate of a transistor T2 are connected to each other through the buffer 22. The buffer 22 may be a known buffer. In the pulse amplification measurement circuit 2, an output signal Out is further amplified by the buffer 22, and the amplified output signal Out is input to the gate of the transistor T2.

Note that, in the pulse amplification measurement circuit 2, the amplifier 21 and the buffer 22 are not essential components. For example, similarly to the pulse amplification measurement circuit 1, in a case of using the inverting amplification circuit 10 (inverting amplification unit) including the three inverting amplifiers 15a to 15c, the amplification factor of the inverting amplification unit is sufficiently high, and the amplifier 21 and the buffer 22 can thus be omitted.

One terminal of the capacitor Ca is connected to each of the source of the transistor T2 and the drain of the transistor T3. That is, one terminal of the capacitor Ca is connected to the transistor T1 through the transistor T3. A voltage Vadj (fourth voltage signal) is input to the other terminal of the capacitor Ca. The voltage Vadj may be supplied from, for example, the control circuit 31.

Electric charge can be injected into the capacitor Ca by applying a voltage Vadj having a high level value to the capacitor Ca. Thus, the capacitor Ca may be referred to as electric charge injection capacitance. In addition, the electric charge can be extracted from the capacitor Ca by applying a voltage Vadj having a low level value to the capacitor Ca.

One terminal of the capacitor Cm is connected to each of the source of the transistor T3 and a gate of the transistor T1. The other terminal of the capacitor Cm is grounded. The capacitor Cm is provided for the purpose of holding the voltage Vg (the gate voltage of the transistor T1) described above. The capacitor Cm may be referred to as memory capacitance.

(Example of Change in Each Voltage in Pulse Amplification Measurement Circuit 2)

Figure 5:
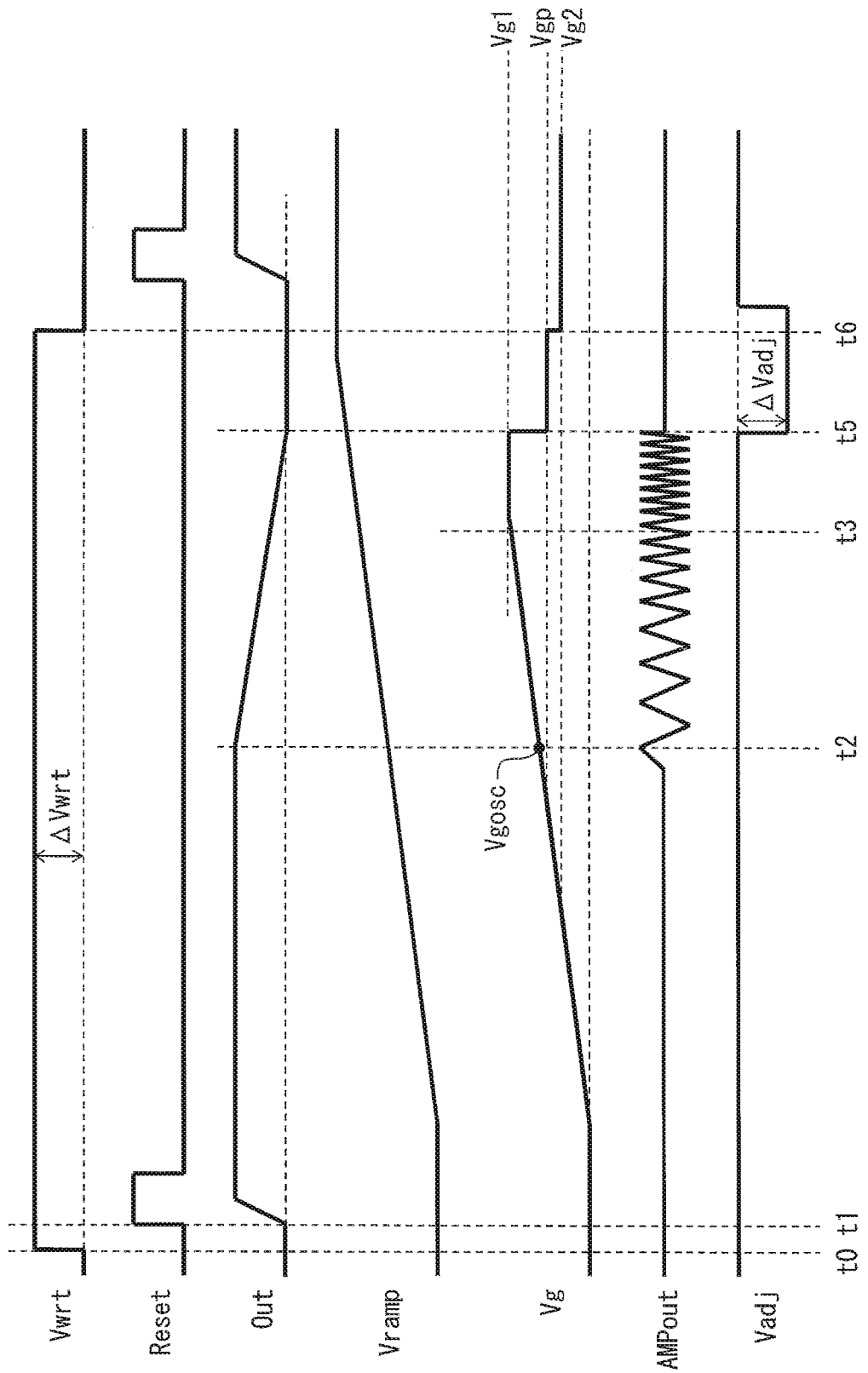
FIG. 5 is a diagram illustrating an example of a change in each voltage in the pulse amplification measurement circuit of FIG. 4.

FIG. 5 is a time chart illustrating an example of a change in each voltage the pulse amplification measurement circuit 2. In FIG. 5, the voltage Vadj is further illustrated, in addition to each voltage illustrated in FIG. 3. A change in each voltage and operation of each member from time t0 to time t3 are similar to those of FIG. 3, and description thereof is thus omitted.

To distinguish FIG. 5 from FIG. 3, in FIG. 5, a time when oscillation is stopped in the inverting amplification circuit 20 is represented as time t5. As illustrated in FIG. 5, the voltage Vadj is set to a high level value from time t0 to time t5.

In the pulse amplification measurement circuit 2, at time t5, the voltage Vadj is switched to a low level value. As electric charge is extracted from the capacitor Ca by the voltage Vadj having the low level value, the electric charge is extracted from the gate of the transistor T1. As a result, the voltage Vg decreases from the voltage Vg1 (first value) to the voltage Vgp (third value). Here, the voltage Vgp is lower than the voltage Vgosc described above. Therefore, the oscillation can be stopped in the inverting amplification circuit 20 by decreasing the voltage Vg to the voltage Vgp. The voltage Vgp is held until time t6 to be described later.

A resistance value between the source and the drain of the transistor T1 at the voltage Vgp is referred to as a third feedback resistance value. The third feedback resistance value is higher than the oscillation start feedback resistance value.

As such, in the pulse amplification measurement circuit 2, the voltage Vg is decreased by the extraction of the electric charge from the capacitor Ca according to the change in the voltage Vadj. That is, in the pulse amplification measurement circuit 2, the voltage Vg can be decreased by an operation different from that of the pulse amplification measurement circuit 1.

Here, the high level value of the voltage Vadj is Vadjh, and (ii) the low level value of the voltage Vadj is Vadj1. In addition, the capacitance of the capacitor Ca and the capacitance of the capacitor Cm are represented as Caux and Cmem, respectively.

Next, a difference between the high level value and the low level value of the voltage Vadj (that is, the amount of change in the voltage Vadj) is represented as $\Delta Vadj=Vadjh-Vadj1$. In addition, a difference between the voltage Vg1 and the voltage Vgp (that is, the amount of change in the voltage Vg) is represented as $\Delta Vg2=Vg1-Vgp$.

In this case, the following Equation (2) is satisfied:

$$\Delta Vg2=(Caux/Cmem)\times \Delta Vadj \qquad (3).$$

That is, the voltage Vgp is represented by the following Equation (3):

$$Vgp=Vg1-(Caux/Cmem)\times \Delta Vadj \qquad (4).$$

As an example, in a case where Caux/Cmem=1 and $\Delta Vadj=0.1$ V, $\Delta Vgp=0.1$ V. That is, a voltage Vgp lower than the voltage Vg1 by 0.1 V can be obtained. By appropriately setting values of Caux/Cmem and $\Delta Vadj$, a desired $\Delta Vg2$ (in other words, Vgp) can be obtained.

Thereafter, at time t6, similarly to the abovementioned time t4 (see FIG. 3), the voltage Vwrt is switched to the low level value, such that the transistor T3 is switched off. As a result, similarly to the pulse amplification measurement circuit 1, the voltage Vg further decreases from Vgp to become a voltage Vg2. After time t6, the voltage Vg2 is held.

As such, the voltage Vg can also be regulated by the pulse amplification measurement circuit 2 so that the inverting amplification circuit 20 does not oscillate. Therefore, an effect similar to that of Embodiment 1 can be obtained.

Embodiment 3

Embodiment 3 is described below with reference to FIGS. 6 and 7. In Embodiment 3, a pixel 30 and a radiation detector 300 each including an amplifier according to an aspect of the present invention are described.

(Pixel 30)

Figure 6:
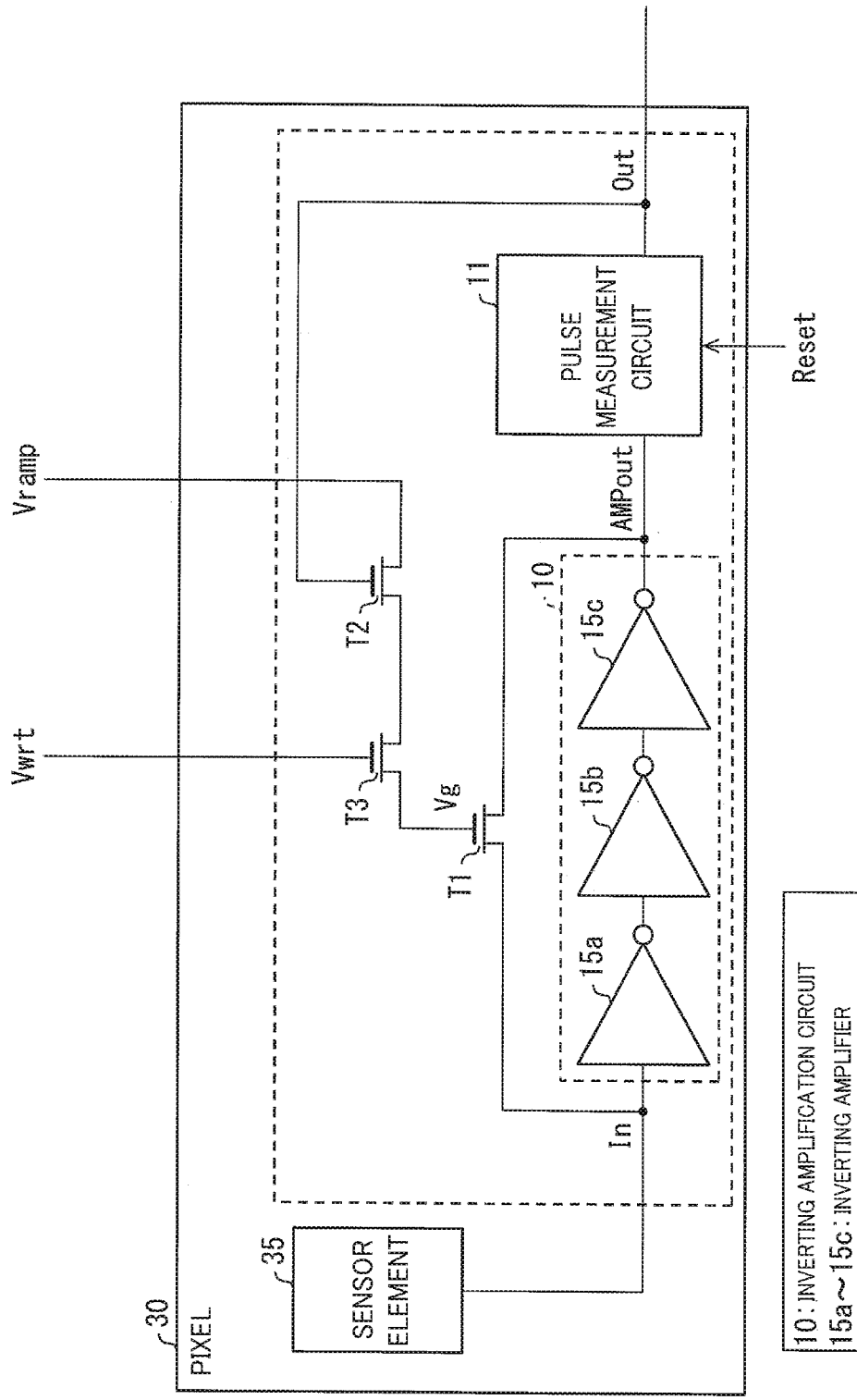
FIG. 6 is a diagram schematically illustrating a configuration of a pixel according to Embodiment 3.

FIG. 6 is a diagram schematically illustrating a configuration of the pixel 30. The pixel 30 in Embodiment 3 includes (i) a sensor element 35 and (ii) each unit of the pulse amplification measurement circuit 1 excluding the voltage sweep circuit 12. However, in the pixel 30, the configuration of the pulse amplification measurement circuit 2 may be applied instead of the configuration of the pulse amplification measurement circuit 1.

As described above, in the pixel 30, the sensor element 35 generates an input signal In as an index of a dose of the radiation detected the sensor element. Then, in the pulse amplification measurement circuit 1, it is possible to generate the output signal Out on the basis of the input signal In. As such, the pixel 30 is the smallest unit (detection unit) for detecting the dose of the radiation.

(Radiation Detector 300)

Figure 7:
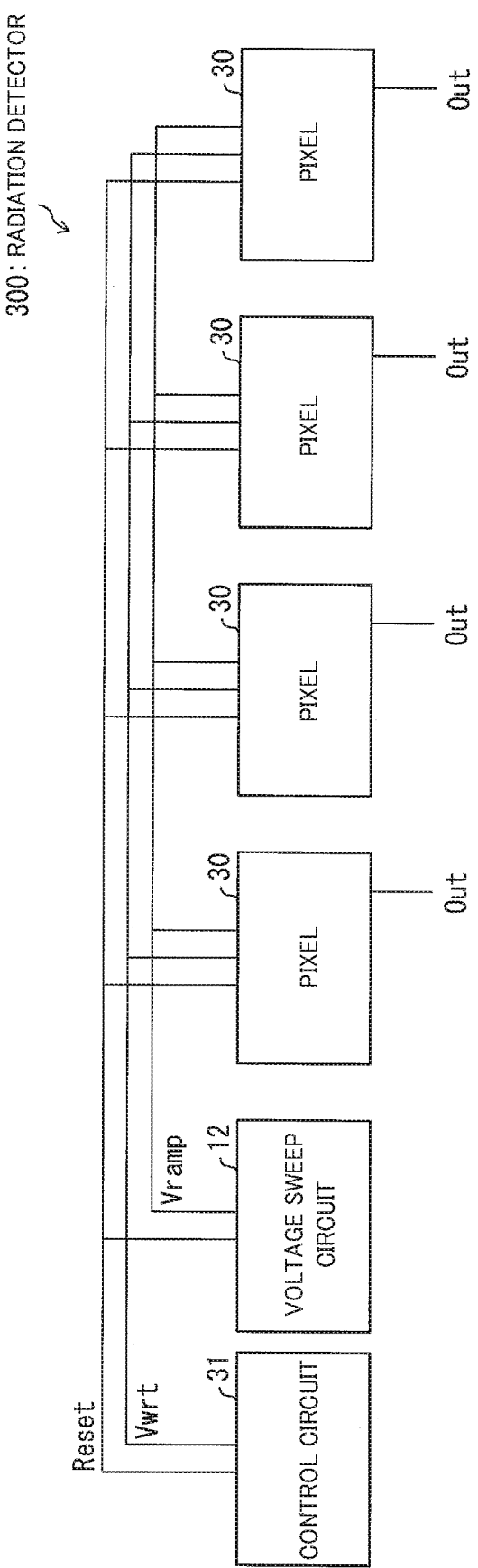
FIG. 7 is a diagram schematically illustrating a configuration of a radiation detector according to Embodiment 3.

FIG. 7 is a diagram schematically illustrating a configuration of a photon-counting radiation detector 300. The radiation detector 300 includes a plurality of (for example, four) pixels 30, a voltage sweep circuit 12, and a control circuit 31. In the radiation detector 300, in a case where the pixels 30 are one-dimensionally (for example, linearly)

arranged, a unit group capable of one-dimensionally detecting (imaging) radiation can be configured.

Alternatively, in the radiation detector 300, in a case where the pixels 30 are arranged two-dimensionally (for example, in a matrix form in a row direction and a column direction), a unit group capable of detecting radiation two-dimensionally can be configured. As such, the pixels 30 may be arranged according to any spatial pattern, depending on the use of the radiation detector 300.

The control circuit 31 generally controls each unit of the radiation detector 300. As described above, the control circuit 31 supplies a reset signal Reset and a voltage Vwrt to each of the plurality of pixels 30 (in other words, each of a plurality of pulse amplification measurement circuits 1).

In FIG. 7, a configuration in which the four pixels 30 share one voltage sweep circuit 12 with one another is exemplified. Accordingly, in the radiation detector 300, the voltage sweep circuit 12 supplies the voltage Vramp to each of the plurality of pixels 30. As such, by causing the plurality of pixels 30 to share the voltage sweep circuit 12 with one another, the circuit area of the radiation detector 300 can be further decreased.

In the radiation detector 300, a plurality of voltage sweep circuits 12 may be provided. If two or more pixels 30 of the plurality of pixels 30 share one voltage sweep circuit with each other, the circuit area of the radiation detector 300 can be decreased. However, to more effectively decrease the circuit area of the radiation detector 300, it is preferable that all of the plurality of pixels 30 share one voltage sweep circuit 12 with one another.

In the radiation detector 300, a mode of counting the number of photons of radiation to detect radiation is referred to as a first mode (counting mode). As an example, in the pulse amplification measurement circuit 1 of FIG. 1, in a case where the pulse measurement circuit 11 is connected to the ADC 14 by the switch 13, the radiation detector 300 can be operated in the first mode.

In addition, in the radiation detector 300, a mode of regulating a feedback resistance value (a resistance value between the source and the drain of the transistor T1) of the inverting amplification circuit 10 is referred to as a second mode (regulating mode). As an example, in the pulse amplification measurement circuit 1, in a case where the pulse measurement circuit 11 is connected to the gate of the transistor 2 by the switch 13, the radiation detector 300 can be operated in the second mode.

As such, the radiation detector 300 can be operated in any one of the first mode and the second mode. Therefore, an operation method (control method) of the radiation detector 300 may include a first step of operating the radiation detector 300 in the first mode and a second step of operating the radiation detector 300 in the second mode.

Next, as understood from Embodiment 1 (particularly FIG. 3) described above, the second step may include (i) a step of decreasing the feedback resistance value so that the inverting amplification circuit 10 is shifted from a state where it does not oscillate to a state in which it does oscillate, (ii) a step of detecting that the inverting amplification circuit 10 oscillates by using the pulse measurement circuit 11, (iii) a step of holding the feedback resistance value at a first feedback resistance value (feedback resistance value at which the oscillation of the inverting amplification circuit 10 continues), and (iv) a step of increasing the feedback resistance value from the first feedback resistance value to a second feedback resistance value (feedback resistance value at which the oscillation of the inverting amplification circuit 10 does not occur) and holding the second feedback resistance value.

[Overview]

An amplifier (pulse amplification measurement circuit 1) according to a first aspect of the present invention is an amplifier provided in a photon-counting radiation detector (300) and includes an inverting amplification unit (inverting amplification circuit 10) that inverts and amplifies an input signal (In) to generate an inverted amplified output (Ampout), a feedback transistor (transistor T1) that connects an input unit and an output unit of the inverting amplification unit to each other, and a pulse measurement unit (pulse measurement circuit 11) that generates an output signal (Out) corresponding to the number of pulses of the inverted amplified output, in which the pulse measurement unit is capable of supplying the output signal toward the feedback transistor.

According to the above configuration, it is possible to cause the pulse measurement circuit 11 to supply the output signal toward the feedback transistor. Therefore, for example, as illustrated in FIG. 3 described above, a gate voltage (voltage Vg) of the feedback transistor can regulated so that the inverting amplification unit does not oscillate.

Therefore, unlike Patent Literature 1, the voltage Vg can be regulated without providing the regulator circuit (the regulator circuit including the oscillation detector and the ramp generator) of Patent Literature 1. Therefore, the circuit area of the amplifier can be decreased compared with the related art.

According to a second aspect of the present invention, preferably the amplifier according to the first aspect may further include a switch (13) that switches a supply destination of the output signal from the pulse measurement unit either (i) toward the feedback transistor or (ii) to the outside of the amplifier.

According to the above configuration, it is possible to cause the pulse measurement circuit 11 to supply the output signal toward the feedback transistor by switching the switch.

According to a third aspect of the present invention, in the amplifier according to the first or second aspect, preferably in a case where the pulse measurement unit supplies the output signal toward the feedback transistor, the pulse measurement unit is connected to a gate of a second transistor (T2), the second transistor is connected to a gate of the feedback transistor through a third transistor (T3), at a point in time before the inverting amplification unit oscillates, the second transistor and the third transistor are switched on and a gate voltage (Vg) of the feedback transistor increases according to a second voltage signal supplied to the second transistor, at a point in time when the gate voltage of the feedback transistor reaches an oscillation start value (Vgosc), the inverting amplification unit may start to oscillate, at a point in time after the inverting amplification unit starts to oscillate, the gate voltage of the feedback transistor may be held at a first value (Vg1) larger than the oscillation start value by switching off the second transistor as the oscillation of the inverting amplification unit continues, and at a point in time after the gate voltage of the feedback transistor is held at the first value, the gate voltage of the feedback transistor may be held at a second value (Vg2) smaller than the oscillation start value by extracting electric charge from the feedback transistor in accordance with a change in a third voltage signal supplied to the third transistor.

As described above, preferably the voltage Vg may be sufficiently high within the range in which the inverting amplification unit does not oscillate. According to the above configuration, the voltage Vg can be held at the second value (Vg2) at which the oscillation of the inverting amplification unit does not occur. Accordingly, the voltage Vg can be regulated, for example, by controlling the amount of change in the third voltage signal and setting the second value to the value (value sufficiently close to Vgosc) immediately before the oscillation.

According to a fourth aspect of the present invention, the amplifier according to the third aspect may further include a capacitor (Ca), in which one terminal of the capacitor is connected to the feedback transistor through the third transistor, a fourth voltage signal (voltage Vadj) is supplied to another terminal of the capacitor, and at the point in time after the gate voltage of the feedback transistor is held at the first value, the gate voltage of the feedback transistor is held at a third value smaller than the oscillation start value by extracting electric charge from the feedback transistor in accordance with a change in the fourth voltage signal.

According to the above configuration, the voltage Vg can be held at the third value (Vg3) at which the oscillation of the inverting amplification unit does not occur. Therefore, the voltage Vg can also be regulated by this configuration.

A radiation detector according to a fifth aspect of the present invention may preferably include amplifier according to any one of the first to fourth aspects and a sensor element (35) that generates the input signal corresponding to a dose of radiation incident on the sensor element.

According to the above configuration, an effect similar to that of the amplifier according to an aspect of the present invention is obtained.

According to a sixth aspect of the present invention, preferably the radiation detector according to the fifth aspect may include a plurality of amplifiers each of which is the amplifier according to any one of the first to fourth aspects and one or more voltage sweep units (voltage sweep circuits 12) that output a second voltage signal increasing a gate voltage of the feedback transistor at a point in time before the inverting amplification unit oscillates and two or more amplifiers of the plurality of the amplifiers may share one of the one or more voltage sweep units with each other.

According to the above configuration, the circuit area of the radiation detector can be more effectively decreased.

According to a seventh aspect of the present invention, in the radiation detector according to the sixth aspect, preferably all of the plurality of the amplifiers may share the one voltage sweep unit with one another.

According to the above configuration, the circuit area of the radiation detector can be more effectively decreased.

A radiation detector control method according to an eighth aspect of the present invention is a radiation detector control method for controlling the radiation detector according to any one of the fifth to seventh aspects and may preferably include a first step of operating the radiation detector in a first mode of counting a number of photons of the radiation to detect the radiation by switching the supply destination of the output signal from the pulse measurement unit toward the feedback transistor and a second step of operating the radiation detector in a second mode of regulating the feedback resistance value of the inverting amplification unit by switching the supply destination of the output signal from the pulse measurement unit to the outside of the amplifier.

According to the above configuration, an effect similar to that of the amplifier according to an aspect of the present invention is obtained.

According to a ninth aspect of the present invention, in the radiation detector control method according to the eighth aspect, preferably the second step may include a step of decreasing the feedback resistance value so that the inverting amplification unit is shifted from a state where the inverting amplification unit does not oscillate to a state in which the inverting amplification unit does oscillate, a step of detecting that the inverting amplification unit oscillates by using the pulse measurement unit, a step of holding the feedback resistance value at a first feedback resistance value at which the oscillation of the inverting amplification unit continues, and a step of increasing the feedback resistance value from the first feedback resistance value to a second feedback resistance value at which the oscillation of the inverting amplification unit does not occur and holding the second feedback resistance value According to the above configuration, an effect similar to that of the amplifier according to an aspect of the present invention is obtained.

[Appendix]

An aspect of the present invention is not limited to the embodiments described above and various modifications can be made within the scope of the claims, and embodiments obtained by appropriately combining technical means disclosed in different embodiments with each other are also included in the technical scope of an aspect of the present invention. Furthermore, new technical features can be formed by combining technical means disclosed in each embodiment with each other.

[Other Expressions of Aspect of the Present Invention]

An aspect of the present invention can also be expressed as follows.

A pulse amplification measurement circuit according to an aspect of the present invention includes an inverting amplifier, a feedback transistor that connects an input unit and an output unit of the inverting amplifier to each other, and a pulse measurement circuit that changes an output corresponding to a number of pulses output from the inverting amplifier, in which the pulse measurement circuit operates in a first state in which a pulse signal amplified by the inverting amplifier is counted and a second state in which oscillation of the inverting amplifier is detected.

In addition, pulse amplification measurement circuit according to an aspect of the present invention further includes a voltage sweeping unit that changes a gate voltage of the feedback transistor, in which in the second state, an operation of changing the gate voltage of the feedback transistor and holding a gate voltage at a point in time when oscillation of the inverting amplifier is detected and an operation of returning the gate voltage at the point in time when the oscillation of the inverting amplifier is detected to a gate voltage immediately before the inverting amplifier oscillates and holding the gate voltage immediately before the inverting amplifier oscillates are performed.

In addition, the pulse amplification measurement circuit according to an aspect of the present invention performs the operation of returning the gate voltage at the point in time when the oscillation of the inverting amplifier is detected to a gate voltage immediately before the inverting amplifier oscillates by injecting a predetermined amount of electric charge into an electrode to which the gate voltage is applied.

Further, the pulse amplification measurement circuit according to an aspect of the present invention includes a capacitance element connected to the gate electrode and injects the electric charge into the gate electrode by switching a voltage of a terminal of the capacitance element that is not connected to the gate electrode.

In addition, a radiation detector according to an aspect of the present invention includes a plurality of pulse amplification measurement circuits according to an aspect of the present invention, in which two or more of the pulse amplification measurement circuits share the voltage sweep unit with each other.

REFERENCE SIGNS LIST 1, 2 Pulse amplification measurement circuit (amplifier)
10, 20 Inverting amplification circuit (inverting amplification unit)
11 Pulse measurement circuit (pulse measurement unit)
12 Voltage sweep circuit (voltage sweep unit)
13 Switch
35 Sensor element
300 Radiation detector
T1 Transistor (feedback transistor)
T2 Transistor (second transistor)
T3 Transistor (third transistor)
Ca Capacitor
In Input signal
Out Output signal
Vramp Voltage (second voltage signal)
Vwrt Voltage (third voltage signal)
Vadj Voltage (fourth voltage signal)
Vg Voltage (gate voltage of feedback transistor)
Vgosc Voltage (oscillation start value)
Vg1 Voltage (first value)
Vg2 Voltage (second value)
Vgp Voltage (third value)

The invention claimed is:

1. An amplifier provided in a photon-counting radiation detector, the amplifier comprising:
an inverting amplification unit that inverts and amplifies an input signal to generate an inverted amplified output a feedback transistor that connects an input unit and an output unit of the inverting amplification unit to each other; and
a pulse measurement unit that generates an output signal corresponding to a number of pulses of the inverted amplified output, wherein
the pulse measurement unit is capable of supplying the output signal toward the feedback transistor,
in a case where the pulse measurement unit supplies the output signal toward the feedback transistor,
the pulse measurement unit is connected to a gate of a second transistor,
the second transistor is connected to a gate of the feedback transistor through a third transistor,
at a point in time before the inverting amplification unit oscillates, the second transistor and the third transistor are switched on and a gate voltage of the feedback transistor increases according to a second voltage signal supplied to the second transistor,
at a point in time when the gate voltage of the feedback transistor reaches an oscillation start value, the inverting amplification unit starts to oscillate,
at a point in time after the inverting amplification unit starts to oscillate, the gate voltage of the feedback transistor is held at a first value larger than the oscillation start value by switching off the second transistor as the oscillation of the inverting amplification unit continues, and
at a point in time after the gate voltage of the feedback transistor is held at the first value, the gate voltage of the feedback transistor is held at a second value smaller than the oscillation start value by extracting electric charge from the feedback transistor in accordance with a change in a third voltage signal supplied to the third transistor.

2. The amplifier according to claim 1, further comprising a capacitor, wherein
one terminal of the capacitor is connected to the feedback transistor through the third transistor,
a fourth voltage signal is supplied to another terminal of the capacitor, and
at the point in time after the gate voltage of the feedback transistor is held at the first value, the gate voltage of the feedback transistor is held at a third value smaller than the oscillation start value by extracting electric charge from the feedback transistor in accordance with a change in the fourth voltage signal.

3. A radiation detector comprising:
the amplifier according to claim 1; and
a sensor element that generates the input signal according to a dose of radiation incident on the sensor element.

4. The radiation detector according to claim 3, wherein the radiation detector includes:
a plurality of amplifiers each of which is the amplifier; and
one or more voltage sweep units that output the second voltage signal increasing the gate voltage of the feedback transistor at the point in time before the inverting amplification unit oscillates, and
two or more amplifiers of the plurality of the amplifiers share one of the one or more voltage sweep units with each other.

5. The radiation detector according to claim 4, wherein all of the plurality of the amplifiers share the one voltage sweep unit with one another.

6. A radiation detector control method for controlling the radiation detector according to claim 3, the method comprising:
a first step of operating the radiation detector in a first mode of counting a number of photons of the radiation to detect the radiation by switching a supply destination of the output signal from the pulse measurement unit toward the feedback transistor; and
a second step of operating the radiation detector in a second mode of regulating a feedback resistance value of the inverting amplification unit by switching the supply destination of the output signal from the pulse measurement unit to the outside of the amplifier.

7. The radiation detector control method according to claim 6, wherein
the second step includes:
a step of decreasing the feedback resistance value so that the inverting amplification unit is shifted from a state where the inverting amplification unit does not oscillate to a state in which the inverting amplification unit does oscillate;
a step of detecting that the inverting amplification unit oscillates by using the pulse measurement unit;
a step of holding the feedback resistance value at a first feedback resistance value at which the oscillation of the inverting amplification unit continues; and
a step of increasing the feedback resistance value from the first feedback resistance value to a second feedback resistance value at which the oscillation of the inverting amplification unit does not occur and holding the second feedback resistance value.

* * * * *